United States Patent
Kwak et al.

(10) Patent No.: US 7,126,165 B2
(45) Date of Patent: Oct. 24, 2006

(54) LIGHT EMITTING DEVICE ASSEMBLY

(75) Inventors: Joon-seop Kwak, Gyeonggi-do (KR); Jong-wan Kim, Gyeonggi-do (KR); Su-hee Chae, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/938,556

(22) Filed: Sep. 13, 2004

(65) Prior Publication Data

US 2005/0072984 A1 Apr. 7, 2005

(30) Foreign Application Priority Data

Oct. 4, 2003 (KR) .................... 10-2003-0068991

(51) Int. Cl.
*H01L 33/00* (2006.01)
*H01L 23/48* (2006.01)

(52) U.S. Cl. .................... 257/99; 257/737; 257/782; 257/786

(58) Field of Classification Search ................ 257/99, 257/786, 737, 778–783
See application file for complete search history.

(56) References Cited

U.S. PATENT DOCUMENTS

| | | | | |
|---|---|---|---|---|
| 5,940,679 A | * | 8/1999 | Tomura et al. | ................ 438/15 |
| 6,194,782 B1 | * | 2/2001 | Katchmar | ................. 257/738 |
| 6,291,775 B1 | * | 9/2001 | Saitoh | .................. 174/250 |

\* cited by examiner

*Primary Examiner*—Ori Nadav
(74) *Attorney, Agent, or Firm*—Buchanan Ingersoll PC

(57) ABSTRACT

Provided is a light emitting device assembly. The light emitting device assembly includes a submount including bumps, each having a bonded surface and a lateral surface surrounding the bonded surface; and a light emitting device including pads, each having a bonded surface corresponding to a bonded surface of a corresponding bump. Herein, edges of the bonded surface of each of the bumps are spaced a predetermined distance inward from edges of a corresponding pad.

8 Claims, 7 Drawing Sheets
(2 of 7 Drawing Sheet(s) Filed in Color)

BEFORE BONDING          AFTER BONDING

LIGHT EMITTING DEVICE ASSEMBLY

This application claims the priority of Korean Patent Application No. 2003-68991, filed on Oct. 4, 2003, in the Korean Intellectual Property Office, the disclosure of which is incorporated herein in its entirety by reference.

BACKGROUND OF THE INVENTION

1. Field of the Invention

The present invention relates to a light emitting device assembly, and more particularly, to a flip-chip bonding type light emitting device assembly.

2. Description of the Related Art

Generally, a laser beam of a laser diode (LD), which has a narrow frequency bandwidth and a good property of going straight ahead, has been recently put to practical use in the fields of optical communications, multiple communications, and space communications. One of major applications of the LD, along with the optical communications, is a pickup for an optical disc.

A GaN semiconductor LD includes a plurality of compound semiconductor layers, which are grown by crystalline grain growth and stacked on a substrate formed of sapphire, GaN, or SiC. Specifically, such compound semiconductor layers as an n-type GaN contact layer, an n-type AlGaN/GaN clad layer, an n-type GaN wave guide layer, an InGaN active layer, a p-type GaN wave guide layer, a p-type AlGaN/GaN clad layer, and a p-type GaN contact layer are sequentially stacked on the substrate. In the GaN semiconductor LD having the above-described stack structure, a ridge for forming a p-type electrode is provided on the uppermost portion of the LD. A passivation layer is formed between the ridge and the p-type electrode to define a conducting path in the semiconductor stack structure.

The GaN semiconductor LD is flip-chip bonded to a submount to facilitate transfer of heat generated during drive. By the flip-chip bonding, a top surface of a light emitting device, such as the LD where the p-type electrode is formed, is fixed to the submount using a solder bump.

When the light emitting device is flip-chip bonded to the submount, since the light emitting device and the submount are directly connected to each other using the solder bump, thermal resistance and line resistance are reduced as compared with when wire bonding is used.

FIG. 1 is a schematic cross-sectional view of a light emitting device assembly in which a light emitting device is flip-chip bonded to a submount.

In FIG. 1, reference numeral 10 denotes the light emitting device, such as an LD, and 21 denotes the submount. The light emitting device 10 is turned over to be bonded to the submount 21. The light emitting device 10 includes a compound semiconductor layer 12 and a substrate 11 on which the compound semiconductor layer 12 is grown. The compound semiconductor layer 12 includes an n-type compound semiconductor layer (not shown), a p-type compound semiconductor layer (not shown), and an active layer (not shown) disposed therebetween. A first pad layer 22a and a second pad layer 22b are formed on the submount 21. The first pad layer 22a and the second pad layer 22b respectively face two stepped regions of the compound semiconductor layer 12 and are spaced apart from each other. The two stepped regions of the compound semiconductor layer 12 correspond to a region where an n-type electrode (not shown) is formed and a region where a p-type electrode (not shown) is formed, respectively. There is a step difference S between the two stepped regions. A pad 13a is formed in the region where the n-type electrode is formed, and a pad 13b is formed in the region where the p-type electrode is formed. The pads 13a and 13b are in contact with the n-type electrode and the p-type electrode, respectively.

A solder bump 30a is interposed between the pad 13a disposed on the compound semiconductor layer 12 and the corresponding first pad layer 22a disposed on the submount 21, and a solder bump 30b is interposed between the pad 13b disposed on the compound semiconductor layer 12 and the corresponding second pad layer 22b disposed on the submount 21. The solder bumps 30a and 30b each include stacked conductive materials.

Specifically, the solder bump 30a includes a first gold layer 31a that contacts the pad 13a of the light emitting device 10, a first platinum layer 33a that contacts the first pad layer 22a, and an AuSn solder 32a disposed therebetween. Likewise, the solder bump 30b includes a second gold layer 31b that contacts the pad 13b of the light emitting device 10, a second platinum layer 33b that contacts the second pad layer 22b, and an AuSn solder 32b disposed therebetween.

The light emitting device 10 is turned over and the solder bumps 30a and 30b are closely bonded to the pads 13a and 13b, respectively, due to a predetermined pressure. In this state, the resultant structure is heated for several seconds to a temperature of about 280° C. or higher. As a result, the light emitting device 10 is fixed to the submount 21 by the solder bumps 30a and 30b. However, in this conventional light emitting device 10, the pads 13a and 13b are unreliably bonded to the solder bumps 30a and 30b, respectively, because of the following reasons.

Typically, the pads 13a and 13b of the light emitting device 10 are patterned using lift-off. When lift-off is used, as shown in a left view of FIG. 2, which illustrates a conventional light emitting device assembly before bonding, a flare type fence 14 is formed along an edge of each of the pads 13a and 13b. Accordingly, as shown in a right view of FIG. 2, which illustrates the conventional light emitting device assembly after bonding, when the pads 13a and 13b come close to the bumps 30a and 30b, the pads 13a and 13b become the first portions that contact the top surfaces of the bumps 30a and 30b. After the pads 13a and 13b are closely bonded to the bumps 30a and 30b, a gap is formed between the pads 13a and 13b and the bumps 30a and 30b due to the protruding fences 4.

FIG. 3A is a microscopic photograph of the pads 13a and 13b of the light emitting device 10, FIG. 3B is an exploded scanning electronic microscope (SEM) photograph of a portion illustrated with a left circle shown in FIG. 3A, and FIG. 3C is an exploded SEM photograph of a portion illustrated with a right circle shown in FIG. 3A.

As shown in FIG. 3A, pads are disposed on both outer portions of the light emitting device 10. The pads are formed using a typical method, i.e., lift-off. Thus, as described above, fences are formed along edges of the pads, respectively. It can be seen from FIGS. 3B and 3C that metal fences are formed during the lift-off. The metal fences are produced when a metal material is torn off during the lift-off, and each of them has a greater height than adjacent portions.

FIG. 4A is a photograph of the conventional light emitting device assembly in which the light emitting device is fixed to the submount, and FIG. 4B is a photograph of a plan view of a solder bump of the submount after the light emitting device is separated from the submount. In the light emitting device assembly bonded as shown in FIG. 4A, a gap occurs between the solder bump and the pad of the light emitting device and thus, the solder bump is badly bonded to the pad.

This poor bonding state not only precludes effective heat emission, but also increases contact resistance between the pad and the bump, thus resulting in an elevation of driving voltage.

SUMMARY OF THE INVENTION

The present invention provides a light emitting device assembly, which effectively prevents a gap between a light emitting device and a bump. Thus, a pad of the light emitting device is reliably bonded to the bump, thus enabling effective heat emission and a reduction of driving voltage.

According to an aspect of the present invention, there is provided a light emitting device assembly including a submount including bumps, each having a bonded surface and a lateral surface surrounding the bonded surface; and a light emitting device including pads, each having a bonded surface corresponding to a bonded surface of a corresponding bump. Herein, edges of the bonded surface of each of the bumps are spaced a predetermined distance inward from edges of a corresponding pad.

The lateral surface of each of the bumps may be inclined at a predetermined angle with respect to the bonded surface of each of the bumps.

The lateral surface of each of the bumps may be perpendicular to the bonded surface of each of the bumps.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The above and other features and advantages of the present invention will become more apparent by describing in detail exemplary embodiments thereof with reference to the attached drawings in which.

DETAILED DESCRIPTION OF THE INVENTION

Figure 1:
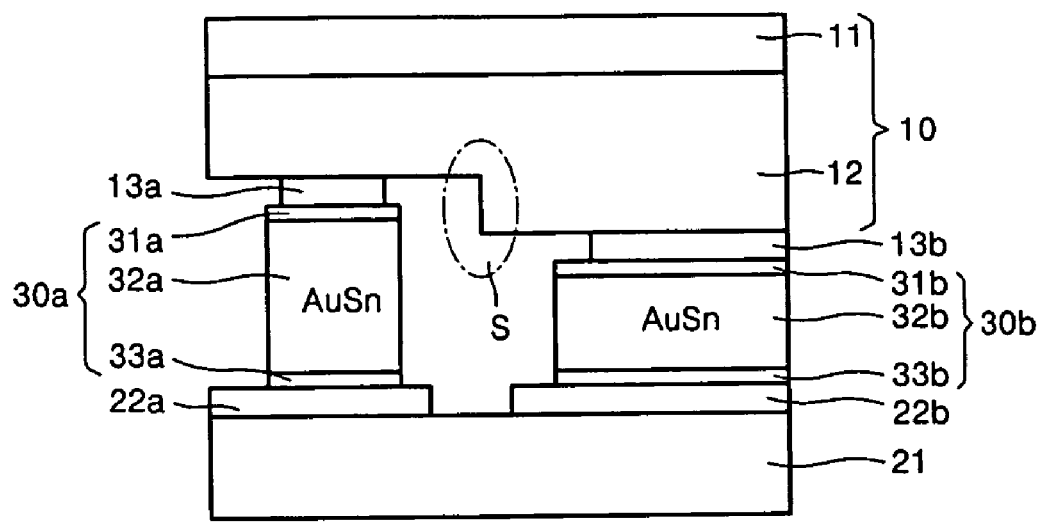
FIG. 1 is a schematic cross-sectional view of a conventional light emitting device assembly.

The present invention will now be described more fully with reference to the accompanying drawings, in which exemplary embodiments of the invention are shown. In the drawings, the thicknesses, sizes, and arrangements of layers and regions are exaggerated for clarity of explanation.

Figure 5A:
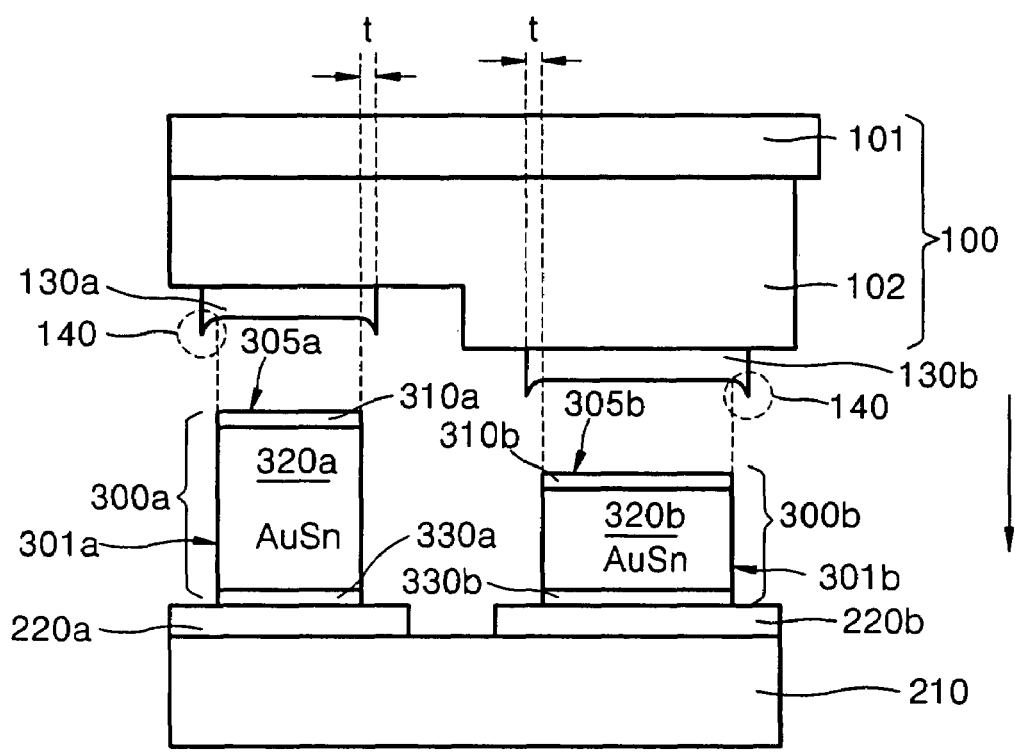
FIG. 5A is a schematic cross-sectional view of a light emitting device assembly according to an embodiment of the present invention.
Figure 5B:
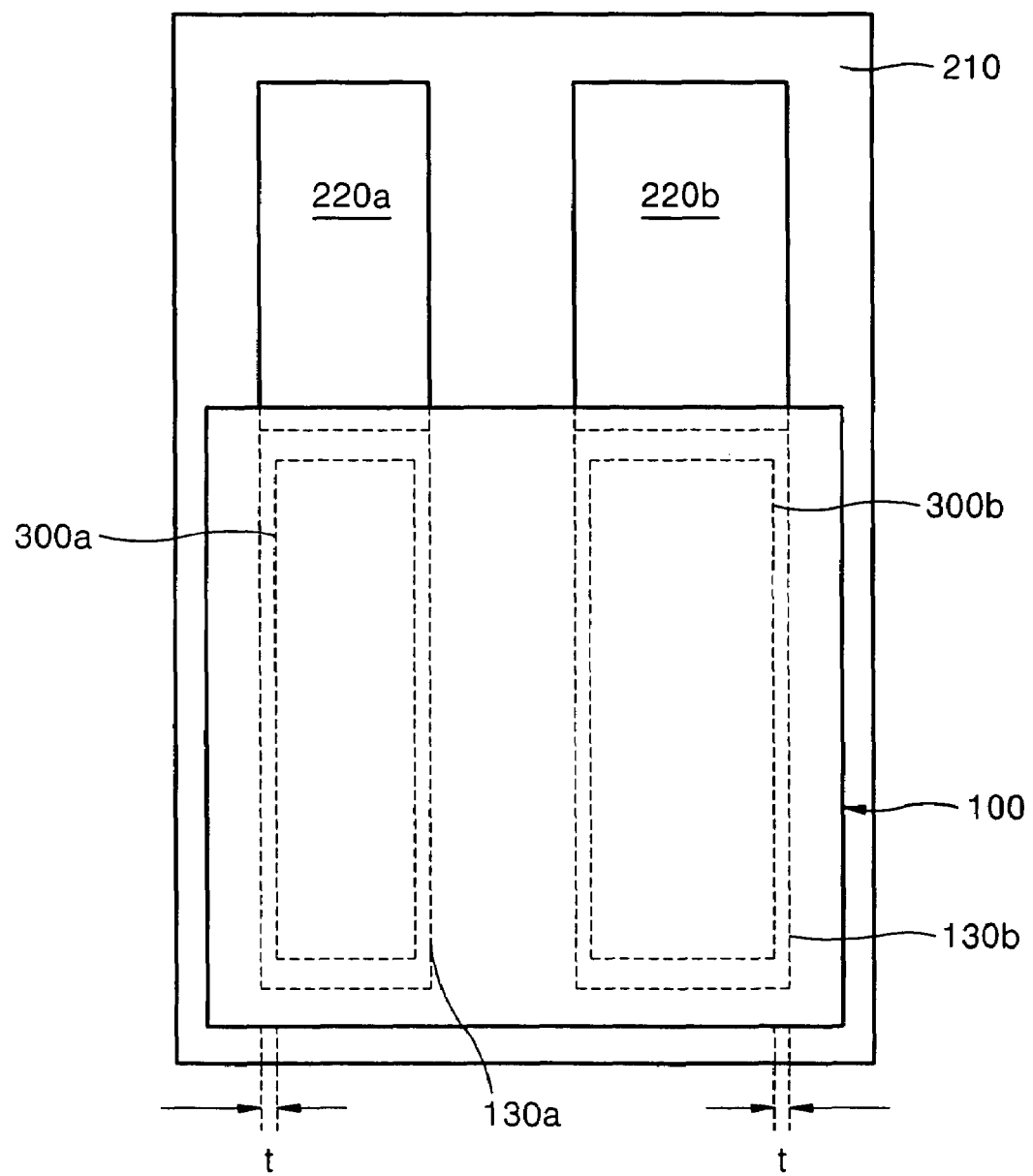
FIG. 5B is a plan view of the light emitting device assembly shown in FIG. 5A to explain a relationship between pads 130a and 130b and bumps 300a and 300b.

FIG. 5A is a schematic cross-sectional view of a light emitting device assembly according to an embodiment of the present invention. The light emitting device assembly may be, for example, a GaN compound semiconductor laser diode (LD) assembly or a light emitting diode (LED) assembly. FIG. 5B is a plan view of the light emitting device assembly shown in FIG. 5A to explain a relationship between pads 130a and 130b and bumps 300a and 300b.

Referring to FIGS. 5A and 5B, a light emitting device 100, such as an LED or LD, includes a substrate 101 and a compound semiconductor layer 102, which is stacked on a bottom surface of the substrate 101. The substrate 101 may be a highly resistive substrate, such as a sapphire substrate, or a transparent substrate that transmits rays emitted from the compound semiconductor layer 102. The compound semiconductor layer 102 includes an n-type compound semiconductor layer (not shown), a p-type compound semiconductor layer (not shown), and an active layer (not shown) disposed therebetween. When the light emitting device 100 is an LD, an n-type clad layer may be further interposed between the active layer and the n-type compound semiconductor layer, and a p-type clad layer may be further interposed between the active layer and the p-type compound semiconductor layer. A first pad layer 220a and a second pad layer 220b are formed on a submount 21. The first and second pad layers 220a and 220b respectively face two stepped regions of the compound semiconductor layer 102 and are spaced apart from each other. The two stepped regions of the compound semiconductor layer 102 correspond to a region where an n-type electrode (not shown) is formed and a region where a p-type electrode (not shown) is formed, respectively. Also, a pad 130a is formed in the region where the n-type electrode is formed, and a pad 130b is formed in the region where the p-type electrode is formed. The pads 130a and 130b are in contact with the n-type electrode and the p-type electrode, respectively.

A solder bump 300a is interposed between the pad 130a disposed on the compound semiconductor layer 102 and the corresponding first pad layer 220a disposed on the submount 210. Likewise, a solder bump 300b is interposed between the pad 130b disposed on the compound semiconductor layer 102 and the corresponding second pad layer 220b disposed on the submount 210.

The solder bump 300a includes a first gold layer 310a that contacts the pad 130a of the light emitting layer 100, a first platinum layer 330a that contacts the first pad layer 220a, and an AuSn solder 320a disposed therebetween. Also, the solder bump 300b includes a second gold layer 310b that contacts the pad 130b of the light emitting layer 100, a second platinum layer 330b that contacts the first pad layer 220b, and an AuSn solder 320b disposed therebetween.

Figure 2:
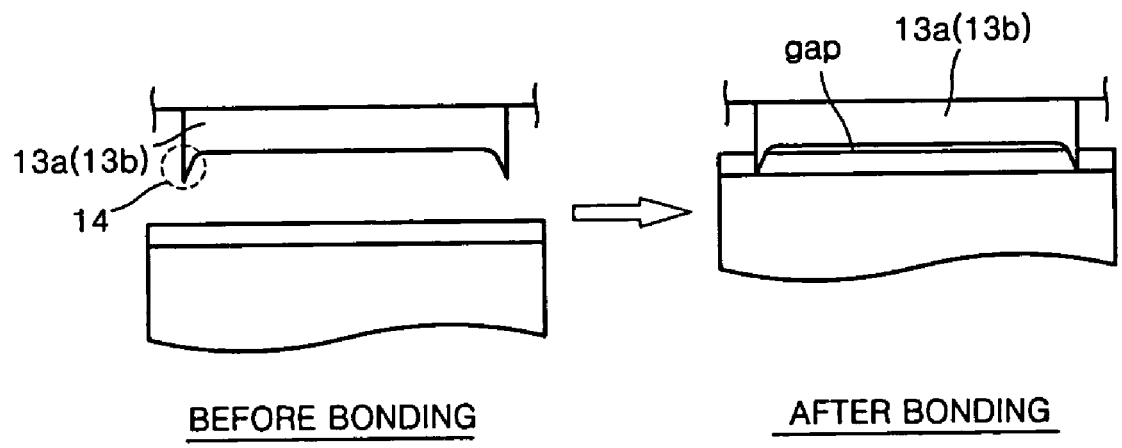
FIG. 2 is a view for explaining a gap between bonded surfaces due to fences formed at pads of a light emitting device of the conventional light emitting device assembly.
Figure 3A:
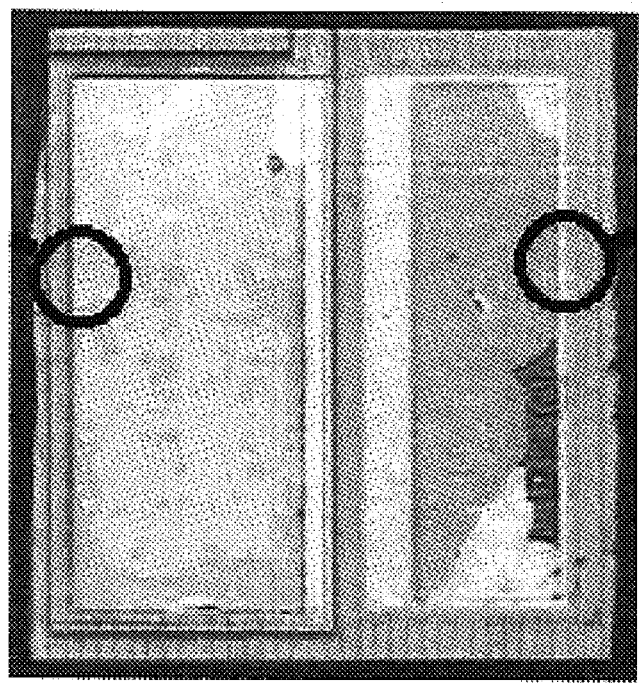
FIG. 3A is a microscopic photograph of the pads of the conventional light emitting device, which are formed by lift-off.
Figure 3B:
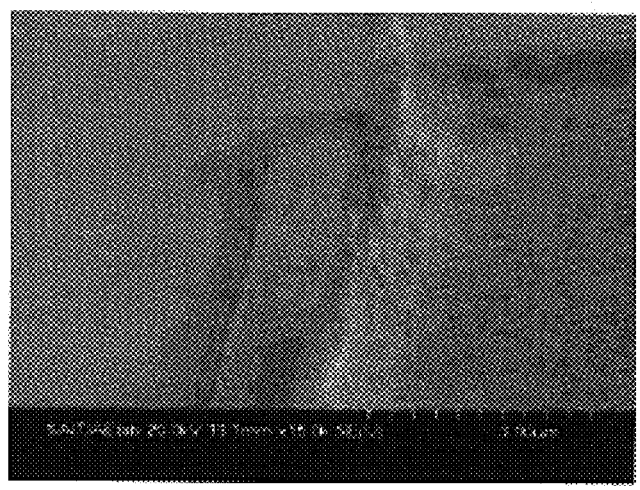
FIG. 3B is a scanning electronic microscope (SEM) photograph of a fence formed along an edge of a pad by lift-off, which corresponds to a portion illustrated with a left circle shown in FIG. 3A.
Figure 3C:
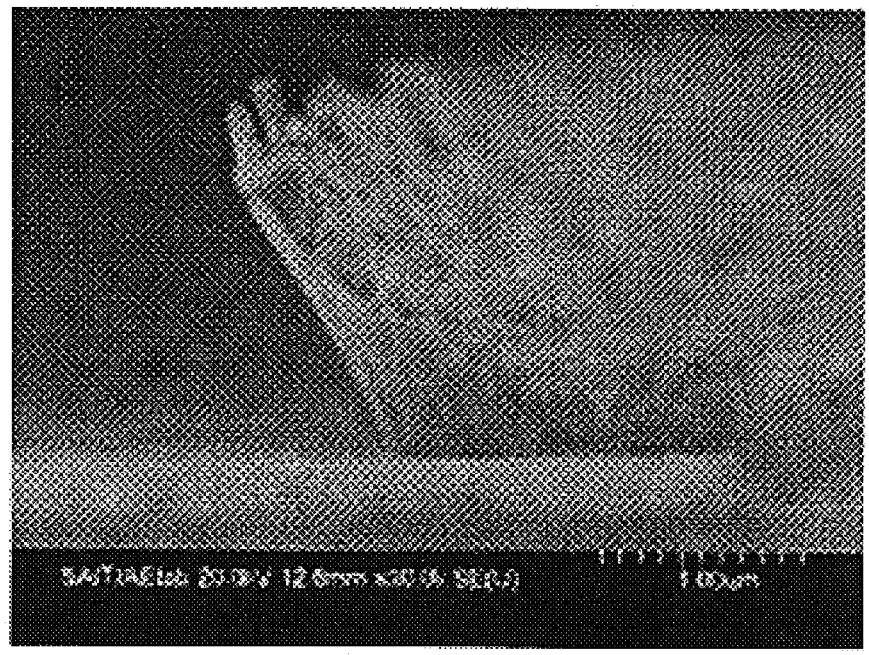
FIG. 3C is an SEM photograph of a fence formed along an edge of another pad by lift-off, which corresponds to a portion illustrated with a right circle shown in FIG. 3A.
Figure 4A:
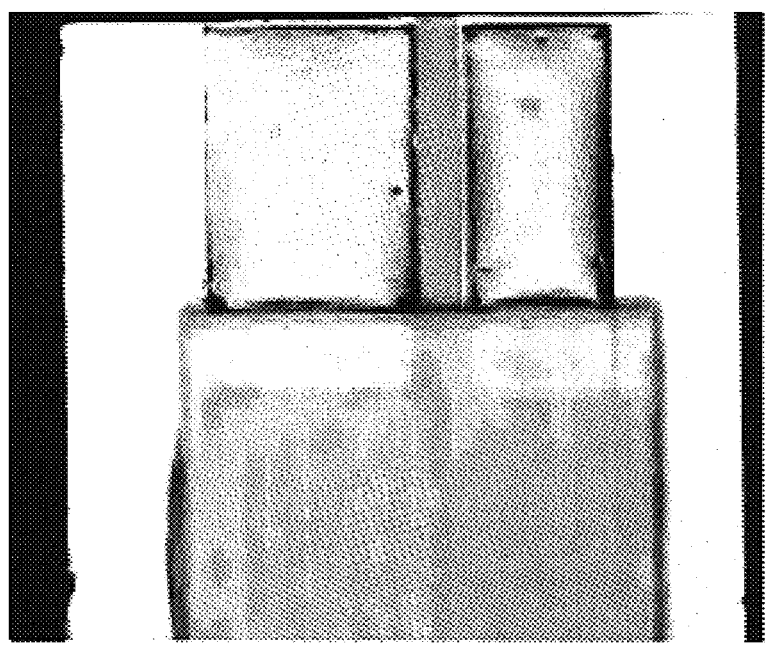
FIG. 4A is a photograph of the conventional light emitting device assembly in which the light emitting device is fixed to a submount.
Figure 4B:
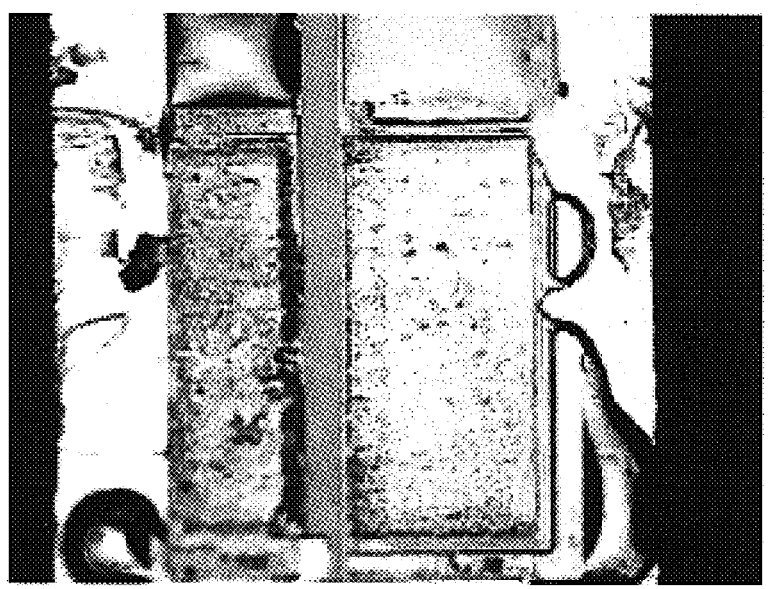
FIG. 4B is a photograph of a plan view of a solder bump of the submount after the light emitting device is separated from the submount.

In the light emitting device assembly having the above-described structure, the solder bumps 300a and 300b respectively have smaller bonded surfaces 305a and 305b than those of the corresponding pads 130a and 130b of the light emitting device 100. Thus, when the bumps 300a and 300b are bonded to the pads 130a and 130b, respectively, edges of the bumps 300a and 300b are spaced a predetermined distance "t" apart from edges of the pads 130a and 130b, respectively. Accordingly, the bonded surfaces 305a and 305b of the bumps 300a and 300b are not affected by fences 140 produced along the edges of the pads 130a and 130b of the light emitting device 100. As a result, when the bonded surfaces 305a and 305b of the bumps 300a and 300b are completely bonded to the pads 130a and 130b, respectively, of the light emitting device 100, there is no gap (refer to the right view shown in FIG. 2) therebetween.

To remove the gap between the bumps 300a and 300b and the pads 130a and 130b as described above, the areas of the bonded surfaces 305a and 305b of the bumps 300a and 300b are appropriately reduced so that the bonded surfaces 305a and 305b of the bumps 300a and 300b are not in contact with the fences 140 formed along the edges of the pads 130a and 130b, respectively, of the light emitting device 100. In the present embodiment, the areas of the bonded surfaces 305a and 305b are reduced so as not to contact the fences 140 by uniformly reducing horizontal sectional areas of the bumps 300a and 300b. Thus, lateral surfaces 301a and 301b of the bumps 300a and 300b are perpendicular to the submount 210 and the substrate 101 of the light emitting device 100.

Figure 6:
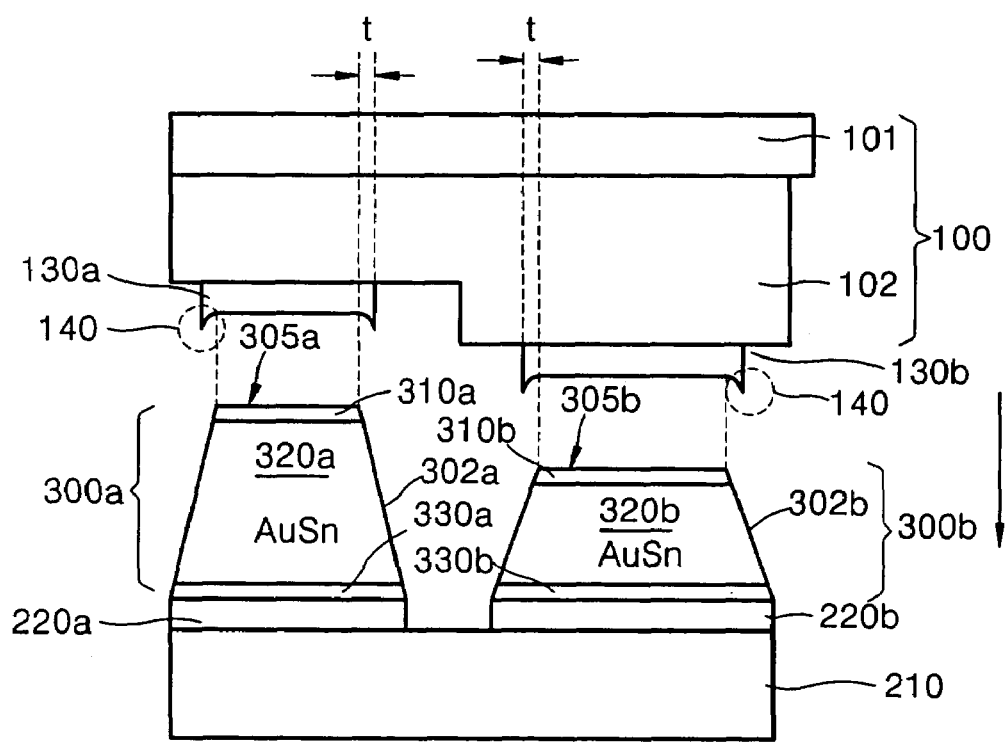
FIG. 6 is a schematic cross-sectional view of a light emitting device assembly according to another embodiment of the present invention.

FIG. 6 is a schematic cross-sectional view of a light emitting device assembly according to another embodiment of the present invention. In FIG. 6, lateral surfaces 302a and 302b of bumps 300a and 300b are inclined with respect to a submount 210 and a substrate 101 of a light emitting device 100.

Referring to FIG. 6, in the light emitting device assembly of the present embodiment, the lateral surfaces 302a and 302b of the bumps 300a and 300b are inclined such that the bumps 300a and 300b each have a trapezoidal sectional shape. These bumps 300a and 300b, each having the trapezoidal sectional shape, are more stable against an external force applied to bonded surfaces 305a and 305b as compared with the bumps of the previous embodiment.

The light emitting device assembly, which is described in detail with reference to the drawings, is not limited to specific kinds of light emitting devices or specific stack structures of bumps. That is, the light emitting device assembly of the present invention can include any bumps, which have smaller bonded areas than pads of a light emitting device and of which edges are spaced a predetermined distance from edges of the pad. Here, all of four edges of a bump may not be located inside the edges of a pad. For example, two long edges of the four edges of the bump may be located inside the edges of the pad, while two short edges thereof may be located outside the edges of the pad. In the conventional case, all of four edges of the bump come into contact with the fence formed at the edges of the pad and thus, a gap is inevitably caused between the bump and the fence. However, in the present invention, as the bump is not in contact with the fence on at least two edges, the gap between the bump and the fence is greatly reduced. Nevertheless, it is preferable that all of four edges of the bump be spaced apart from the fence of the pad.

As explained thus far, according to the present invention, flip-chip bonding is enabled to provide good bonded surfaces between bumps and pads for a light emitting device. As a result, contact resistance between the bumps and the pads can be reduced, the light emitting device can operate at low voltage, and the reliability of the light emitting device assembly can be enhanced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A light emitting device assembly comprising:
  a submount including bumps, each having a bonded surface and a lateral surface surrounding the bonded surface; and
  a light emitting device including pads, each pad having a bonded surface corresponding to a bonded surface of a corresponding bump, said bonded surface of each of said pads including a center portion surrounded by outer edge portions that are defined by projecting portions extending toward the submount:
  wherein outer edge portions of the bonded surface of each of the bumps are offset a predetermined distance inward from corresponding outer edge portions of a corresponding pad sufficient to locate such offset edge portions of the bonded surface out of contact with the projecting portions.

2. The assembly of claim 1, wherein all of the edge portions of the bonded surface of each of the bumps are surrounded by and spaced a predetermined distance apart from the edge portions of the corresponding pad.

3. The assembly of claim 1, wherein the lateral surface of each of the bumps is inclined at a predetermined angle with respect to the bonded surface of each of the bumps.

4. The assembly of claim 2, wherein the lateral surface of each of the bumps is inclined at a predetermined angle with respect to the bonded surface of each of the bumps.

5. The assembly of claim 1, wherein the lateral surface of each of the bumps is perpendicular to the bonded surface of each of the bumps.

6. The assembly of claim 2, wherein the lateral surface of each of the bumps is perpendicular to the bonded surface of each of the bumps.

7. The assembly of claim 1, wherein the light emitting device is a GaN laser diode.

8. The assembly of claim 2, wherein the light emitting device is a GaN laser diode.

* * * * *